(12) United States Patent
Skotnicki et al.

(10) Patent No.: US 7,229,867 B2
(45) Date of Patent: Jun. 12, 2007

(54) PROCESS FOR PRODUCING A FIELD-EFFECT TRANSISTOR AND TRANSISTOR THUS OBTAINED

(75) Inventors: Thomas Skotnicki, Crolles (FR); Daniel Chanemougame, Domene (FR); Stephane Monfray, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 184 days.

(21) Appl. No.: 11/050,411

(22) Filed: Feb. 3, 2005

(65) Prior Publication Data

US 2005/0214993 A1  Sep. 29, 2005

(30) Foreign Application Priority Data

Feb. 3, 2004 (FR) .................................. 04 01018

(51) Int. Cl.
*H01L 21/338* (2006.01)

(52) U.S. Cl. .............................. 438/176; 257/E21.415; 257/E29.274; 257/E29.275; 257/E21.442; 257/E21.209

(58) Field of Classification Search ................. 438/176
See application file for complete search history.

(56) References Cited

U.S. PATENT DOCUMENTS 5,792,679 A    8/1998   Nakato
6,413,802 B1 * 7/2002   Hu et al. ..................... 438/151
6,605,514 B1 * 8/2003   Tabery et al. ............... 438/303
6,645,797 B1 * 11/2003  Buynoski et al. ........... 438/157
6,815,268 B1 * 11/2004  Yu et al. ..................... 438/149
6,992,354 B2 * 1/2006   Nowak et al. ............... 257/347
6,995,412 B2 * 2/2006   Fried et al. ................. 257/296
2002/0093053 A1  7/2002 Chan et al.
2002/0135020 A1  9/2002 Skotnicki et al.
2003/0136963 A1  7/2003 Krivokapic et al.
2003/0178670 A1 * 9/2003 Fried et al. ................. 257/315
2004/0150029 A1 * 8/2004 Lee ............................ 257/308

FOREIGN PATENT DOCUMENTS

WO    WO 01/26160    4/2001

\* cited by examiner

*Primary Examiner*—Walter Lindsay, Jr.
*Assistant Examiner*—Thu-Huong Dinh

(57) ABSTRACT

A substrate supporting a portion of a semiconductor material is used to produce a field-effect transistor. A portion of a temporary material lies between the portion of semiconductor material and the substrate. A gate is formed, which comprises an upper part in rigid connection with the portion of semiconductor material, and at least one bearing part settled on the substrate. The temporary material is removed and replaced with an electrically insulating material. During removal and replacement of the temporary material, the portion of semiconductor material is held in place relative to the substrate by the gate.

8 Claims, 3 Drawing Sheets

PROCESS FOR PRODUCING A FIELD-EFFECT TRANSISTOR AND TRANSISTOR THUS OBTAINED

TECHNICAL FIELD OF THE INVENTION

The present invention relates generally to integrated circuits, and particularly to a process for producing a field-effect transistor of the metal-oxide-semiconductor (MOS) type.

BACKGROUND OF THE INVENTION

It is known to produce transistors within a layer of semiconductor material that is electrically insulated from the substrate by an intermediate oxide layer. A circuit that incorporates such transistors consumes less energy thanks to the elimination of leakage currents between the transistors and the substrate, the latter generally being connected to an electrical earth of the circuit. Such a circuit is known by the name SOI (Silicon On Insulator).

In an SOI circuit, control of the conduction of a transistor by the gate is degraded when the level of integration of the circuit increases. This degradation stems mainly from short channel effects or SCE, which are due to the thickness of the layer of semiconductor material within which the transistor is produced. When the length of the channel, measured in the direction of conduction of the transistor, is less than 0.05 microns, the short channel effects are perceptible for a thickness of the layer of semiconductor material of greater that 15 nanometers.

Furthermore, in substrates currently available for producing SOI circuits, the thickness of the layer of semiconductor material is not controlled to better than 10 nanometers. This results in dispersion of the electrical characteristics of the transistors fabricated at various places on a specified substrate, especially a dispersion of the threshold voltages.

Moreover, the currently available substrates for producing SOI-type transistors possess a relatively thick insulating intermediate layer. The thickness of this layer varies between 145 and 400 nanometers. The implantation into the substrate of electrically doping species, so as to give it a suitable electrical conductivity, is therefore difficult through the two layers of semiconductor material and of insulating material. The effect of the earth plane created with respect to the transistors by this implantation beneath the insulating intermediate layer is consequently reduced, especially because of the increased distance between each transistor and the substrate. The short channel effects are therefore increased.

SUMMARY OF THE INVENTION

To address the above-discussed deficiencies of the prior art, one object of the present invention consists in proposing a process for producing electrically isolated transistors on the substrate, the process being compatible with a high level of integration, and for which the above drawbacks are reduced.

The invention thus proposes a process for producing a field-effect transistor, comprising the following steps:

a) obtaining a conducting substrate that supports a portion of a semiconductor material above a surface of said substrate, with a portion of a temporary material between the portion of semiconductor material and the substrate;

b) forming a gate that comprises an upper part, in rigid connection with said portion of semiconductor material, and at least one bearing part settled on the substrate, the gate being obtained so as to be electrically isolated from the portion of semiconductor material and from a conducting part of the substrate;

c) removing the temporary material, the gate holding said portion of semiconductor material in place relative to the substrate so that an empty space is created between said portion of semiconductor material and the substrate in place of the portion of temporary material; and d) filling said empty space at least partly with an insulating material.

In addition to reducing the abovementioned drawbacks, one advantage of the process of the invention lies in suppressing the need of forming volumes of electrical insulation around the transistor. Indeed, such volumes of insulation, for example of the LOCOS (LOCal Oxidation of Silicon) or STI (Shallow Trench Isolation) type, occupy large portions of the surface of the substrate. They consequently limit the level of integration of the circuit. Moreover, these volumes of insulation cause planarity defects of the surface from which the transistors are produced, along the edges of these volumes. The electrical insulation of a transistor produced according to the invention, with respect to neighbouring electronic components placed on the surface of the substrate, is provided by the insulating material formed in place of the temporary material and by a spacing gap left between the transistor and each neighbouring component.

Another advantage of the process of the invention lies in the fact that transistors produced with identical process parameter values at separate places on a substrate, or on different substrates, have identical operating characteristics. This results from the control of the thicknesses of the portions of temporary material and of semiconductor material, which control can be achieved in a precise manner. The long series of identical transistors may thus be fabricated.

Optionally, the process may include, before step b), an additional step of forming a region of increased electrical insulation that extends at least partly between the bearing part of the gate and the conducting part of the substrate. Any residual leakage currents between the gate of the transistor and the substrate are thus eliminated.

When the region of increased electrical insulation is formed by oxidation, by bringing a part of the substrate into contact with an oxidizing fluid, various precautions may be adopted in order to prevent deterioration, especially oxidation, of a portion of semiconductor material. Among these precautions, the process may include, before the step of forming the region of increased electrical insulation, a step of forming an upper coating impermeable to the oxidizing fluid, said upper coating being placed on the portion of semiconductor material. The upper coating is then removed after the region of increased electrical insulation has been formed.

The process may also include, as an additional precaution, a step of forming a peripheral coating impermeable to the oxidizing fluid, which coating covers a lateral surface of the layer of semiconductor material. This peripheral coating, which protects the lateral surface of the layer of semiconductor material, is formed before the step of forming the region of increased electrical insulation.

The invention also relates to a field-effect transistor produced using a process as described above. Such a transistor provides precise control of the conduction between the source and the drain, and has a very low leakage current in the direction of the substrate.

Finally, the invention relates to an integrated circuit comprising such a field-effect transistor. Such a circuit may advantageously have a high level of integration. Furthermore, it has a reduced electrical consumption since the leakage current of the transistor in the direction of the substrate of the circuit is very low.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the present invention will become apparent in the following description of a non-limiting example of how to implement it, with reference to the appended drawings in which like reference numerals represent like parts, in which.

DETAILED DESCRIPTION OF THE INVENTION

FIGS. 1-10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 7:
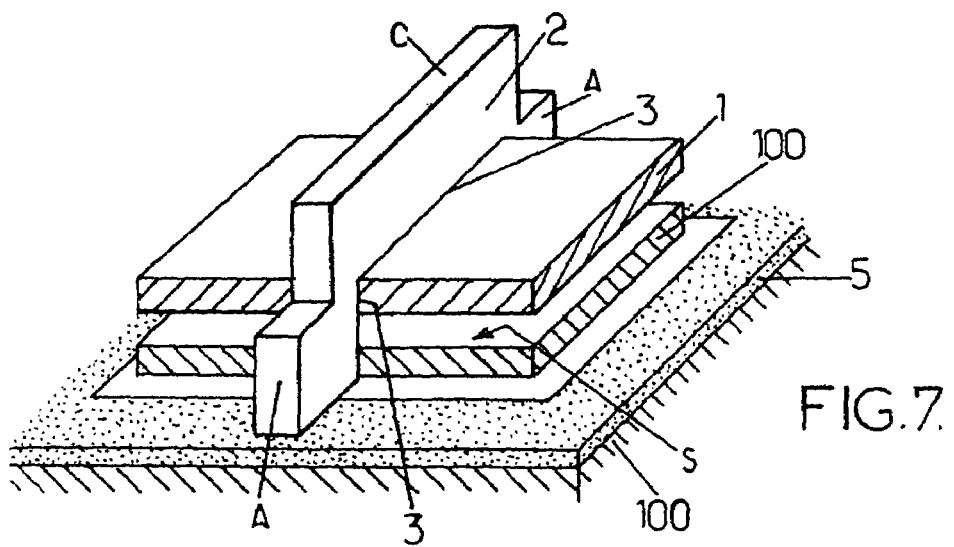
Figure 8:
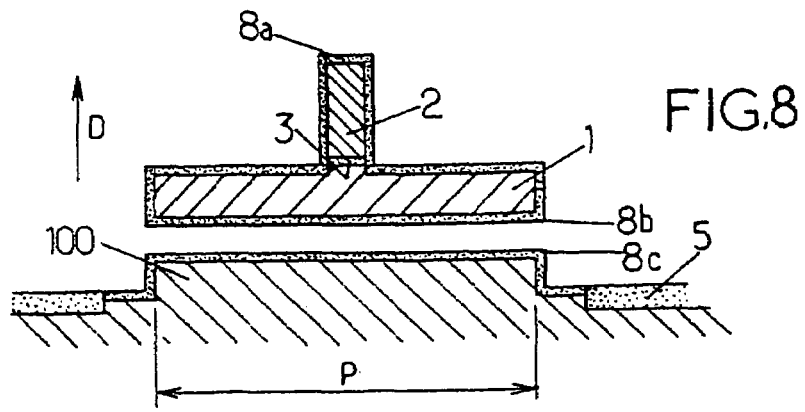
Figure 9:
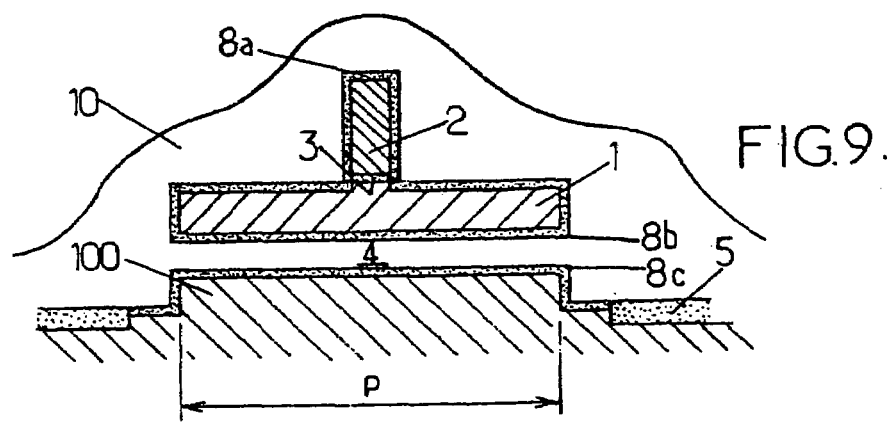
Figure 10:
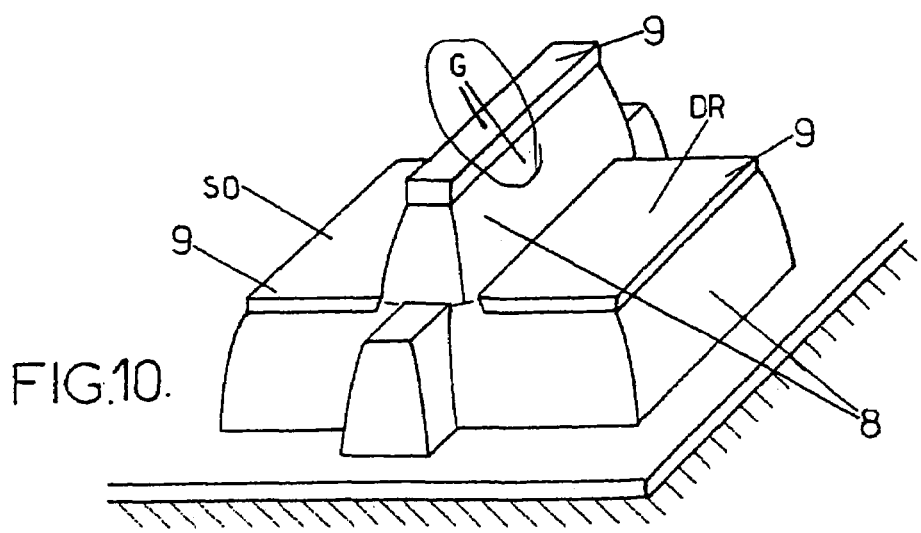

In the figures, for the sake of clarity, the dimensions of the various parts of the circuit that are shown have not been drawn to scale. The FIGS. 1 to 7 and 10 are perspective views of an integrated circuit comprising various materials added to a substantially plane surface of a substrate. FIGS. 8 and 9 are cross sections of the same circuit corresponding to steps of the transistor production process that are intermediate between those of FIGS. 7 and 10. The substrate is placed in the lower part of each figure and the arrow D indicates the direction perpendicular to the surface of the substrate, oriented upwards. The terms <<on>>, <<under>>, <<above>>, <<beneath>> and <<upper>> are used hereafter with reference to the direction of the arrow D.

Moreover, in what follows, individual steps of the transistor production process that are carried out using methods known to those skilled in the art will not be explained in detail. Indications will be given only regarding the combination of these individual steps in a defined chronological order of execution, which characterizes the invention.

Figure 1:
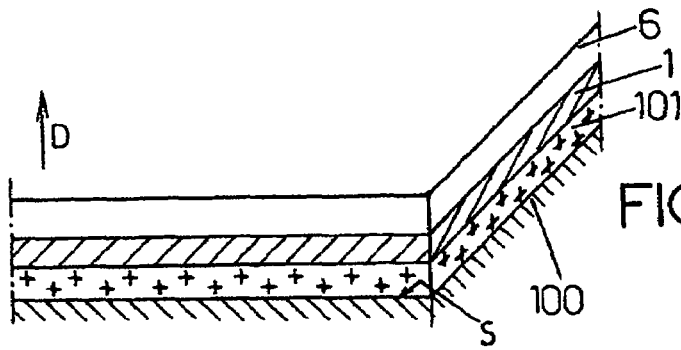
FIGS. 1 to 10 illustrate successive steps in the production of a field-effect transistor according to one method of implementing the present invention.

In FIG. 1, a substrate 100 made of conducting material is covered on its upper surface S with a layer of a temporary material 101. In the example described, the layer 101 is in direct contact with the substrate 100. The layer 101 is itself covered with a layer of a semiconductor material 1 in direct contact with the layer 101. The temporary material is chosen so that, firstly, it has a crystal structure compatible with the respective crystal structures of the material of the substrate 100 and of the semiconductor material. Secondly, it is also chosen to be able to be selectively removed relative to the material of the substrate 100 and to the semiconductor material, when a suitable removal process is used.

The substrate 100 is made of substantially single-crystal silicon and the material of the layer 101 comprises a silicon-germanium alloy. Preferably, the layer 101 is made of a silicon-germanium alloy whose germanium atomic fraction is, for example, about 27%. In other words, the layer 101 is made of $Si_{1-x}Ge_x$, x being a number between 0.25 and 0.30. The layer 101 is formed by epitaxial growth from the surface S of the substrate 100. Thus, the temporary material is also substantially single-crystal. The layer 101 possesses a thickness of less than about 80 nanometers, preferably less than about 50 nanometers.

The semiconductor material of the layer 1 comprises silicon and, compared with the material of the layer 101, is devoid of germanium. It is obtained by epitaxial growth from the upper surface of the layer 101 of temporary material. The semiconductor material of the layer 1 is therefore also substantially single-crystal. The layer 1 preferably possesses a thickness of less than about 30 nanometers, for example about 25 nanometers.

The layer 1 is itself covered with an oxygen-impermeable first layer 6. The layer 6 may, for example, be made of silicon nitride ($Si_3N_4$) and may possess a thickness of around 60 nanometers. It is formed by using a process suitable for obtaining a nitride material that has a sufficient density, so as to constitute an effective barrier against oxygen diffusion. The use of the layer 6 is not absolutely essential for implementing the invention. Its function will be explained below.

Optionally, a first stop layer (not shown in FIG. 1) may be formed between the layer 1 and the layer 6. The first stop layer may be made of silica ($SiO_2$). It may be obtained using a standard deposition process, carried out before the layer 6 is formed. The thickness of the first stop layer may, for example, be about 8 nanometers.

The layer 1 and the substrate 100 may then be implanted in respective parts corresponding to the position of the final transistor, so as to give them suitable electrical conductivities. Preferably, the implanted parts of the layer 1 and of the substrate 100 are obtained at the same time. They then have electrical conductivities of the same type, p or n. This implantation is carried out in a known manner and will not be recalled here.

The layers 6, 1 and 101 are then etched in succession, for example using a directional plasma etching process called dry anisotropic etching. To do this, ions are accelerated parallel to the direction of the arrow D, in the opposite sense thereto, and are sent against the upper surface of the circuit. A resist mask (not shown) was formed beforehand on the upper surface of the circuit, above a region P of the surface S of the substrate. The region P is intended to support the final transistor. In the embodiment described here, the region P corresponds to the desired place for the final transistor on the substrate 100. The dimensions of the region P, parallel to the surface S, are, for example, about 3 microns by 3 microns. To obtain a precisely defined etching profile, a mask support layer (not shown) may be placed on the layer 6. The support may, for example, be made of silica and have a thickness of about 50 nanometers. It may be obtained by low-pressure chemical vapour deposition (LPCVD) using tetraethoxysilane ($Si(OC_2H_5)_4$) precursor. The layers 6, 1 and 101 are etched outside the region P.

The etching is continued after the surface S has been reached, so as to overetch down to a depth z, for example of 10 nanometres. thus, the upper surface of the substrate 100 is lowered outside the region P relative to the inside of said region P. In case of possible irregularities in the thickness of the layer 101 and/or of the layer 1, this lowering prevents residues of temporary material from remaining outside the region P, and prevents such residues from obstructing correct continuation of the production of the transistor. The lowering also makes it possible to avoid operating disparities between different transistors produced in the same fashion.

Figure 2:
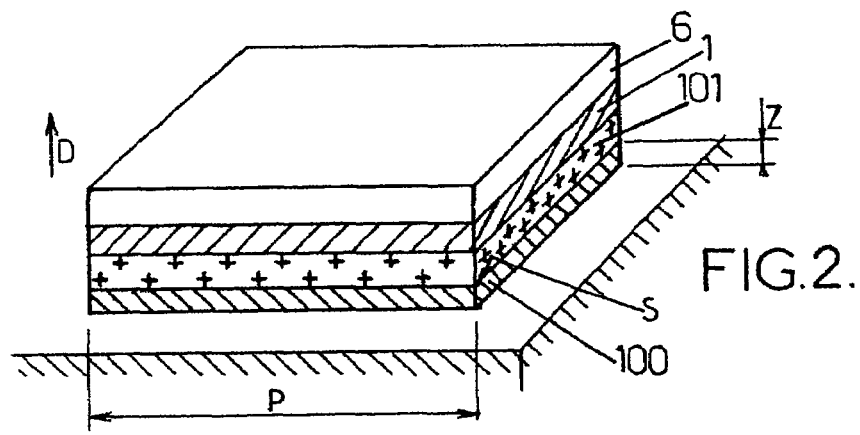
Figure 3:
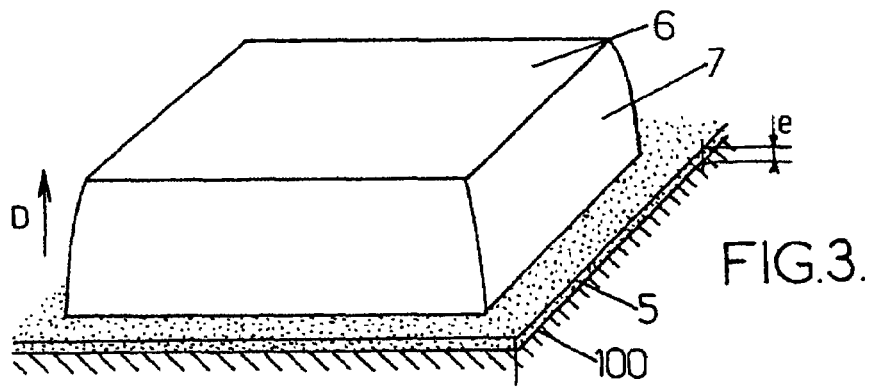

The resist mask and the optional support layer are removed after the etching. The configuration illustrated in FIG. 2 is then obtained. The remaining portions of the layers 6, 1, and 101, hereafter denoted by portions 6, 1 and 101, and also the portion of the substrate 100 in the region P, form a stack located at a certain distance from other structures possibly present on the surface S of the substrate 100.

The circuit is covered with a second stop layer (not shown) made of silica ($SiO_2$), and then with a second layer of an oxygen-impermeable material. The second layer of oxygen-impermeable material may also be made of silicon nitride ($Si_3N_4$). It is etched anisotropically, along the opposite direction to that of the arrow D, in accordance with the method known for producing spacers. An oxygen-impermeable peripheral coating is thus obtained, in the form of a spacer 7 that covers the lateral faces of the stack. In particular, the spacer 7 completely covers the lateral surface of the layer 1.

The circuit is then heated up to about 1050° C., in the presence of oxygen, for a time of about 30 seconds. Another oxidizing gas may be used as a complement to or instead of oxygen, such as carbon dioxide ($CO_2$) or nitrous oxide ($NO_2$), provided that the portion 6 and the spacer 7 are also impermeable to these gases. The exposed upper surface of the substrate 100 is thus oxidized, outside the region P and outside a part of the upper surface of the substrate 100 located around the region P and corresponding to the thickness of the spacer 7. FIGS. 4 to 10 show the circuit with such an unoxidized part of the surface of the substrate 100. In practice, if oxygen atoms diffuse into the substrate 100 under the spacer 7, depending on the actual temperature of the substrate during the exposure of the circuit to the oxidizing gas, such an unoxidized part located beneath the spacer 7 may not exist. The exposed surface of the substrate 100 is thus made of a layer of silica ($SiO_2$), labelled 5 in FIG. 3. The thickness e of the layer 5 in the direction of the arrow D is equal, for example, to about 10 nanometers.

The layer 5 thus formed has good electrical insulation properties: it constitutes a layer of increased electrical insulation. This thermal oxidation step does not impair the materials of the portions 1 and 101. This is because the portions 1 and 101 are isolated from contact with the oxidizing gas by the portion 6 that constitutes an upper coating of the portion 1 and by the spacer 7 that constitutes a barrier against diffusion of the oxidizing gas in directions parallel to the surface S. Thus, the semiconducting material of the portion 1 is protected. Its electrical conduction properties remain unchanged. Furthermore, the possibility of selectively removing the temporary material from the portion 101 is preserved.

During a first removal step, the silicon nitride material of the spacer 7 is removed, using a known selective isotropic etching process. Such an etching process may involve, for example, molecules of phosphoric acid ($H_3PO_4$) introduced into a plasma or an etching solution. This first removal step is continued until the second stop layer is exposed. The presence of the second stop layer makes it possible to prolong the first removal step sufficiently to remove the spacer 7 completely, without any risk of damaging the portion 1. The second stop layer is then removed so as to expose the lateral faces of the stack and the upper surface of the portion 6.

Figure 4:
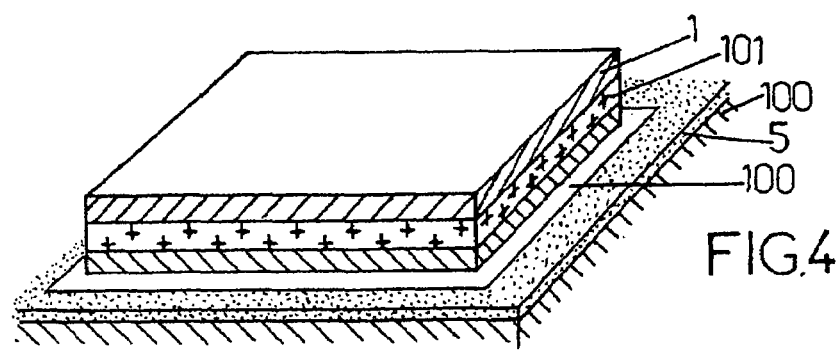

During a second removal step, the portion 6 is removed in turn by an etching process similar to that used for the spacer 7. This second removal step is continued until the first stop layer is exposed. The latter is in turn removed and the configuration illustrated in FIG. 4 is obtained. In this figure, a thin strip of the upper surface of the substrate 100, corresponding to silicon material that has not been oxidized, separates the oxide layer 5 from the lower part of the residual stack, i.e. the initial stack without the portion 6.

Figure 5:
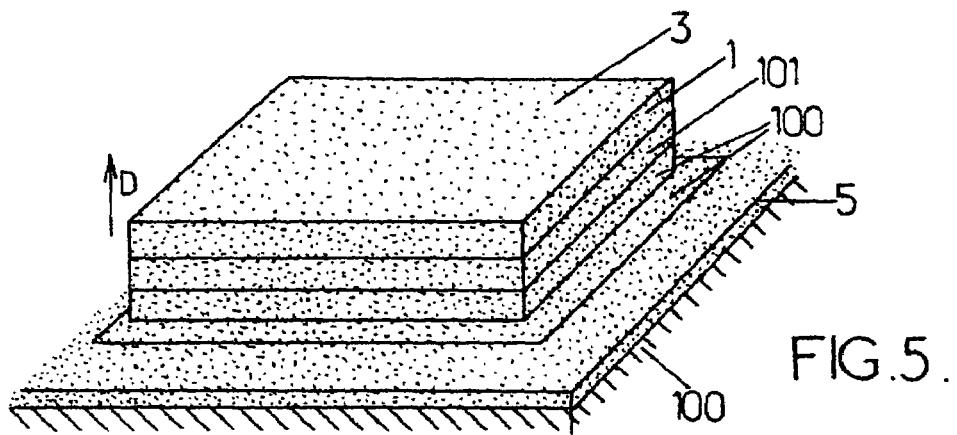

The circuit is then again exposed to an oxidizing gas such as, for example, oxygen or carbon dioxide ($CO_2$), being heated to a temperature of about 1050° C. for a time of between 30 seconds and 1 minute. A thin oxide layer 3 is formed on the upper surface of the portion 1, over the lateral surfaces of the portions 1 and 101 and over the exposed portions of the surface of the substrate 100 that have not yet been oxidized (FIG. 5). The thickness of the layer 3 in the direction of the arrow D is, for example, equal to about 1 nanometers.

Figure 6:
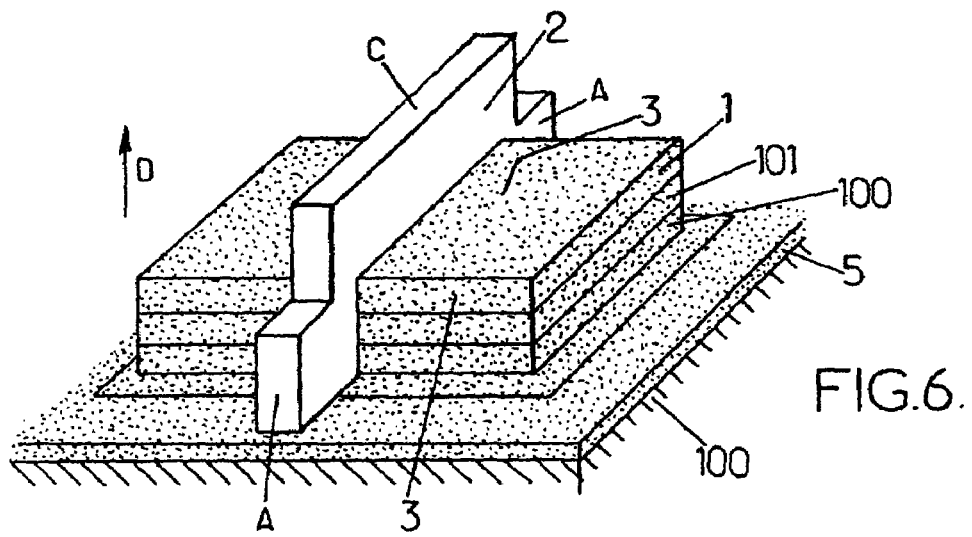

Thus, as illustrated in FIG. 6, a bridge-shaped polysilicon structure 2 is produced on the stack. The structure 2 includes an upper part C placed on a central region of the portion 1. It furthermore includes at least one, and preferably two, lateral bearing parts A that are settled on the upper surface of the substrate 100, on each side of the portions 1 and 101. The thickness of the part C in the direction of the arrow D may be about 120 nanometers. The structure 2 constitutes the gate of the final transistor. It is electrically isolated from the portion 1 by the layer 3 and is electrically isolated from the substrate 100 both by the layer 3 and by the layer 5. In the places where the layer 5 lies between the structure 2 and the upper surface of the substrate 100, the layer 5 provides increased electrical insulation with respect to the places where the layer 3 lies between the structure 2 and the upper surface of the substrate 100.

The circuit is then brought into contact with a solution for etching the layer 3, such as, for example, a solution containing hydrofluoric acid (HF). The duration of contact between the circuit and the solution is chosen so that the exposed parts of the layer 3 are dissolved, while a main part of the layer 5 remains intact, in particular owing to the thickness of the layer 5. Those parts of the layer 3 that lie between the gate 2 and the portion 1, or between the gate 2 and the substrate 100, thus remain intact, as they are preserved by the gate 2 from contact with the etching solution.

The lateral surfaces of the portion 101 are thus exposed, over the four sides of the portion 101, outside the bearing parts A of the gate 2. The circuit is then brought into contact with an etching fluid for isotropically and selectively etching the silicon-germanium alloy material. As is known, when a dry etching process is used to etch the silicon-germanium alloy, the etching plasma may contain a methane ($CH_4$)/tetrafluoromethane ($CF_4$) gas mixture. Alternatively, when a wet etching process is used, the etching fluid may be a solution that is both oxidizing and acidic, such as, for example, a solution containing nitric acid ($HNO_3$). The portion 101 is entirely removed, whereas the silicon material of the portion 1, of the gate 2 and of the substrate 100, and also the silica material of the portion of layer 3 and of the layer 5, remain intact. As illustrated in FIG. 7, the portion 1 is then held by the gate 2 above the substrate 100, with an empty space between the substrate 100 and the portion 1. This empty space possesses a thickness in the direction of the arrow D that is substantially equal to the thickness of the initial portion 101. Therefore this thickness is again preferably less than 50 nanometers. It will be noted that, after having produced a large number of transistors experimentally using the process of the invention, the inventors have confirmed that no rupture of the bearing parts A occurs and that the portion 1 is substantially held in place by the gate 2, parallel to and at a certain distance from the surface S of the substrate 100.

The circuit is once again exposed to an oxidizing gas, while being at the same time heated to a temperature of around 900° C. for about 1 minute, so as to form oxide layers. A layer 8a is thus formed on the exposed faces of the gate 2, a layer 8b is formed on all the faces of the portion 1, and a layer 8c is formed on the substrate 100, inside the region bounded by the layer 5. The layers 8a, 8b and 8c are formed simultaneously and have identical characteristics. FIG. 8 illustrates the configuration of the circuit thus obtained.

Next, insulating material is deposited on the circuit, for example a new deposition of silicon nitride ($Si_3N_4$) using at least one gaseous precursor introduced into a reactive plasma. Material-deposition conditions are adopted that allow complete filling 4 of the space between the portion 1 and the substrate 100 to be obtained in the region P. In particular, a deposition pressure of the order of 10 millitorr results in progressive filling of this space. The deposition is continued until a layer 10 is obtained that covers the entire transistor in the process of being produced. The configuration of the circuit illustrated in FIG. 9 is obtained.

The layer 10 is then anisotropically etched using the procedure for producing spacers. The etching is continued until the upper surface of the gate 2 and the upper surface of the portion 1, on each side of the gate 2, are exposed. Thus, a spacer 8 that covers all the surfaces of the transistor parallel to the arrow D is obtained. A complementary implantation of electrically doping species may be carried out, in a known manner, in the portion 1, on each side of the gate 2, taking advantage of the automatic alignment relative to the gate 2 that is provided by the spacer 8. Finally, the silicon layer 9 may be deposited on the upper surfaces of the gate 2 and of the portion 1. Selective epitaxial growth deposition conditions are preferably adopted. The upper part of the gate 2 thus completed constitutes the gate contact region, denoted by G in FIG. 10. The upper parts of the portion 1 thus completed, lying on each side of the gate 2, constitute the source contact regions, denoted by SO, and the drain contact region, denoted by DR, respectively.

The production of the circuit incorporating the transistor may then be continued in the usual fashion. In particular, the deposited layers 9 may be silicided in order to reduce the electrical resistance between on the one hand, the contact regions SO and DR and the gate contact region G and, on the other hand, external electrical connections. The channel of the transistor corresponds to that part of the portion 1 lying beneath the part C of the gate 2.

Within the final transistor, the filling material 4 deposited in the space between the portion 1 and the substrate 100 fulfills an electrical isolation function. Its role is equivalent to that of oxide layers, called buried oxide layers, present in SOI integrated circuits. Within the final transistor, the layer 5 constitutes a region of increased electrical insulation between the gate 2 and the substrate 100. The layer 3 provides the electrical insulation between the gate 2 and the portion 1.

It will be understood that many alternative methods of implementing the invention may be proposed, relative to the process for producing a transistor that has been described in detail above. These alternative methods remain within the scope of the invention, insofar as a temporary material is used in place of a portion of insulating material lying between the final transistor and the substrate. In particular, the temporary material mentioned in the above description, namely a silicon-germanium alloy, may be replaced with another material.

It should be pointed out that the layer 5 for increasing the electrical isolation of the transistor relative to the conducting substrate is not absolutely essential for the operation of the transistor obtained. This layer 5 was introduced in order to guarantee complete elimination of any leakage currents that might accidentally occur between the gate and the substrate, and to reduce any parasitic capacitance that occurs between the gate and the substrate. However, the leakage currents may be attenuated by just the layer 3, while still ensuring that the transistor operates correctly.

Likewise, the layer 6 and the spacer 7, that are intended in particular to prevent oxidation of the source region, the channel and the drain region of the transistor during formation of the layer 5, are not absolutely essential for implementing the invention.

Finally, the layer 6 and the spacer 7 may be used without the associated stop layers. It is intended that the present invention encompass such changes and modifications as fall within the scope of the appended claims.

What is claimed is:

1. A process for producing a field-effect transistor, comprising:
   a) obtaining a conducting substrate that supports a portion of a semiconductor material above a surface of the substrate, with a portion of a temporary material between the portion of semiconductor material and the substrate;
   b) forming a gate, the gate comprising an upper part, in rigid connection with the portion of semiconductor material, and at least one bearing part coupled to the substrate, the gate being formed so as to be electrically isolated from the portion of semiconductor material and from a conducting portion of the substrate;
   c) removing the temporary material, wherein the gate holds the portion of semiconductor material in place relative to the substrate and an empty space is created between the portion of semiconductor material and the substrate in place of the portion of temporary material; and
   d) filling the empty space at least partly with an insulating material,
   wherein the portion of semiconductor material and the portion of temporary material are obtained by etching respective layers of semiconductor material and of temporary material that are superposed on the surface of the substrate, outside a region intended to support the transistor, until reaching the substrate.

2. The method according to claim 1, wherein the semiconductor material and the temporary material are both substantially single-crystal materials.

3. The process according to claim 2, wherein the semiconductor material is obtained by epitaxial growth from a surface of the temporary material.

4. The process according to claim 1, wherein the temporary material comprises a silicon-germanium alloy and wherein the semiconductor material comprises silicon and is comparatively devoid of germanium.

5. The process according to claim 1, further comprising, before step b), forming a region of increased electrical insulation that extends at least partly between the bearing part of the gate and the conducting part of the substrate.

6. The process according to claim 5, wherein forming a region of increased electrical insulation comprises bringing a part of the substrate into contact with an oxidizing fluid.

7. The process according to claim 6, further comprising:
before forming the region of increased electrical insulation, forming an upper coating impermeable to the oxidizing fluid, on the portion of semiconductor material; and
after forming the region of increased electrical insulation, removing the upper coating.

8. The process according to claim 6, further comprising, before forming the region of increased electrical insulation, forming a peripheral coating impermeable to the oxidizing fluid, on a lateral surface of the portion of semiconductor material.

* * * * *

UNITED STATES PATENT AND TRADEMARK OFFICE
CERTIFICATE OF CORRECTION

| | | |
|---|---|---|
| PATENT NO. | : 7,229,867 B2 | |
| APPLICATION NO. | : 11/050411 | |
| DATED | : June 12, 2007 | |
| INVENTOR(S) | : Thomas Skotnicki et al. | |

It is certified that error appears in the above-identified patent and that said Letters Patent is hereby corrected as shown below:

Column 8, claim 2, line 65, delete "method" and replace with --process--.

Signed and Sealed this
Nineteenth Day of April, 2011

David J. Kappos
*Director of the United States Patent and Trademark Office*